US012634175B2

(12) United States Patent
Kim et al.

(10) Patent No.: US 12,634,175 B2
(45) Date of Patent: May 19, 2026

(54) PAM-4 TRANSMITTER AND TRANSCEIVER USING FFE

(71) Applicant: KOREA UNIVERSITY RESEARCH AND BUSINESS FOUNDATION, Seoul (KR)

(72) Inventors: Chulwoo Kim, Seoul (KR); Youngwook Kwon, Seoul (KR); Jincheol Sim, Seoul (KR); Seung-Woo Park, Seoul (KR); Seongcheol Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 83 days.

(21) Appl. No.: 18/827,131

(22) Filed: Sep. 6, 2024

(65) Prior Publication Data

US 2025/0088394 A1 Mar. 13, 2025

(30) Foreign Application Priority Data

Sep. 7, 2023 (KR) ........................ 10-2023-0118782
Jun. 26, 2024 (KR) ........................ 10-2024-0083374

(51) Int. Cl.
*H04L 25/03* (2006.01)
*H03K 5/00* (2006.01)
(Continued)

(52) U.S. Cl.
CPC ... *H04L 25/03038* (2013.01); *H03K 5/00006* (2013.01); *H03K 17/56* (2013.01); *H04L 25/4917* (2013.01)

(58) Field of Classification Search
CPC .......... H04L 25/03038; H04L 25/4917; H03K 5/00006; H03K 17/56
See application file for complete search history.

(56) References Cited

U.S. PATENT DOCUMENTS 9,571,308 B1 2/2017 Lugthart et al.
2015/0256363 A1* 9/2015 Shvydun ............. H04L 25/4917
375/233

(Continued)

FOREIGN PATENT DOCUMENTS

KR 10-2007-0020478 A 2/2007
KR 10-2019-0016176 A 2/2019
(Continued)

OTHER PUBLICATIONS

Office Action issued on Jul. 1, 2025 for corresponding Korean Patent Application No. 10-2024-0083374, along with an English machine translation (12 pages).

*Primary Examiner* — Jaison Joseph
(74) *Attorney, Agent, or Firm* — Hauptman Ham, LLP

(57) ABSTRACT

The transmitter includes a driver that is connected to an output node and drives the output node with a pulse amplitude modulation-4 (PAM-4) signal having four levels of a most significant bit (MSB) and a least significant bit (LSB), and an equalizer that is connected to the output node and compensates for attenuation of the PAM-4 signal based on a first operating voltage, wherein the equalizer compensates for the attenuation based on applying a second operating voltage having a level greater than a level of the first operating voltage to the output node when a transition from a first level to a second level among the four levels is a rising transition, and compensates for the attenuation based on forming a path for extracting an equalizing current from the output node when the transition from the first level to the second level is a falling transition.

12 Claims, 10 Drawing Sheets

(51) Int. Cl.
    *H03K 17/56*       (2006.01)
    *H04L 25/49*       (2006.01)

(56)           References Cited

U.S. PATENT DOCUMENTS

| | | | |
|---|---|---|---|
| 2017/0359211 A1 | 12/2017 | Dickson et al. | |
| 2018/0278440 A1* | 9/2018 | Dong | H04L 25/03 |
| 2020/0007363 A1* | 1/2020 | Hossain | H04L 7/0058 |
| 2025/0088394 A1* | 3/2025 | Kim | H03K 17/56 |

FOREIGN PATENT DOCUMENTS

| | | |
|---|---|---|
| KR | 10-2252820 B1 | 5/2021 |
| KR | 10-2257233 B1 | 5/2021 |
| KR | 10-2338809 B1 | 12/2021 |
| KR | 10-2430233 B1 | 8/2022 |

* cited by examiner

170

171

PAM-4 TRANSMITTER AND TRANSCEIVER USING FFE

CROSS-REFERENCE TO RELATED APPLICATIONS

The present application claims the benefit of priority to Korean Patent Application Nos. 10-2023-0118782, filed on Sep. 7, 2023, and 10-2024-0083374, filed on Jun. 26, 2024, in the Korean Intellectual Property Office. The aforementioned applications are hereby incorporated by reference in their entireties.

BACKGROUND

Embodiments of the present disclosure described herein relate to a pulse amplitude modulation-4 (PAM-4) transmitter and transceiver using a feed-forward equalizer (FFE).

In general, non-return to zero (NRZ) signaling with two data modulation levels may be used for data communication. The NRZ signaling has a simple transceiver structure, but may transmit only 1 bit of data during 1 unit interval (UI). Therefore, the NRZ signaling is greatly affected by the channel during high-speed data transmission, so it is difficult to implement a high-speed transceiver. To compensate for the shortcomings of NRZ signaling, pulse-amplitude modulation-4 (PAM-4) signaling, which has four data modulation levels and transmits 2 bits in 1 UI, may be used. The PAM-4 signaling may reduce the interval between four levels by a factor of $\frac{1}{3}$ compared to NRZ signaling.

Meanwhile, in a conventional high-speed single-channel input/output circuit, a pre-transform reduction equalizer may be applied to eliminate signal-to-signal interference caused by channel attenuation during signal transmission. Although the pre-transform reduction equalizer is simple to implement, the overall voltage level may be reduced after channel compensation, which may increase the error probability at the receiver. When applying a pre-transform reduction equalizer to the PAM-4 signaling described above, the overall voltage level is lowered compared to NRZ.

SUMMARY

Embodiments of the present disclosure provide a PAM-4 transmitter and transceiver using FFE capable of increasing a data voltage margin.

According to an embodiment, a transmitter includes a driver that is connected to an output node and drives the output node with a pulse amplitude modulation-4 (PAM-4) signal having four levels of a most significant bit (MSB) and a least significant bit (LSB), and an equalizer that is connected to the output node and compensates for attenuation of the PAM-4 signal based on a first operating voltage, wherein the equalizer compensates for the attenuation based on applying a second operating voltage having a level greater than a level of the first operating voltage to the output node when a transition from a first level to a second level among the four levels is a rising transition, and compensates for the attenuation based on forming a path for extracting an equalizing current from the output node when the transition from the first level to the second level is a falling transition.

For example, the equalizer may include a rising equalizer that performs a compensation operation for the rising transition, and a falling equalizer that performs a compensation operation for the falling transition.

For example, the rising equalizer may include a capacitor connected to a first node and a second node, a first P-type transistor having a drain connected to the first node and a source to which the first operating voltage is applied, a second P-type transistor having a drain connected to the second node and a source to which the first operating voltage is applied, a first N-type transistor having a drain connected to the first node and a source grounded, and a third P-type transistor having a source connected to the second node and a drain connected to the output node.

For example, the first operating voltage may be charged in the capacitor as the first P-type transistor and the third P-type transistor are turned off and the second P-type transistor and the N-type transistor are turned on when the transition is not the rising transition, and the second operating voltage may be applied to the output node as the second P-type transistor and the N-type transistor are turned off and the first P-type transistor and the third P-type transistor are turned on when the transition is the rising transition.

For example, the falling equalizer may include an equalizing current source that is connected to a third node and allows the equalizing current to flow into a ground, a second N-type transistor having a drain connected to the output node and a source connected to the third node, a third N-type transistor having a drain connected to the output node and a source connected to the third node, a fourth N-type transistor having a source connected to the third node, and a fifth N-type transistor having a drain to which the first operating voltage is applied and a source connected to a drain of the fourth N-type transistor.

For example, the equalizing current may flow out from the output node as the third N-type transistor to the fifth N-type transistor are turned off and the second N-type transistor is turned on when the transition is the falling transition, and the equalizing current may be maintained as the second N-type transistor and the third N-type transistor are turned off and the fourth N-type transistor and the fifth N-type transistor are turned on when the transition is neither the rising transition nor the falling transition.

For example, the transmitter may further include an encoder that encodes the MSB and the LSB for a plurality of phases and outputs an encoding signal, wherein the encoding signal includes a plurality of first thermometer signals for the rising transition and a plurality of second thermometer signals for the falling transition, and a multiplexer that performs a merging operation for reducing a unit interval (UI) of the plurality of first thermometer signals and the plurality of second thermometer signals.

For example, the multiplexer may output a plurality of merged first thermometer signals and a plurality of merged second thermometer signals according to the merging operation to the equalizer, and the equalizer may perform a compensation operation according to the rising transition or the falling transition based on the plurality of merged first thermometer signals and the plurality of merged second thermometer signals.

For example, the transmitter may further include a clock divider that generates a plurality of clock signals for the plurality of phases, an MSB generator that generates the MSB for each of the plurality of phases based on the plurality of clock signals and outputs the MSB to the encoder, and an LSB generator that generates the LSB for each of the plurality of phases based on the plurality of clock signals and outputs the LSB to the encoder.

According to an embodiment, a transmitter includes a driver that is connected to an output node and drives the output node with a pulse amplitude modulation-4 (PAM-4) signal having four levels of a most significant bit (MSB) and a least significant bit (LSB), and a rising equalizer and a falling equalizer that are connected to the output node and
compensate for attenuation of the PAM-4 signal based on a
first operating voltage, wherein the rising equalizer includes
a capacitor connected to a first node and a second node, a
first P-type transistor having a drain connected to the first
node and a source to which the first operating voltage is
applied, a second P-type transistor having a drain connected
to the second node and a source to which the first operating
voltage is applied, a first N-type transistor having a drain
connected to the first node and a source grounded, and a
third P-type transistor having a source connected to the
second node and a drain connected to the output node, and
the falling equalizer includes an equalizing current source
that is connected to a third node and allows an equalizing
current to flow into a ground, a second N-type transistor
having a drain connected to the output node and a source
connected to the third node, a third N-type transistor having
a drain connected to the output node and a source connected
to the third node, a fourth N-type transistor having a source
connected to the third node, and a fifth N-type transistor
having a drain to which the first operating voltage is applied
and a source connected to a drain of the fourth N-type
transistor.

According to an embodiment, a transceiver includes a
transmitter that transmits a pulse amplitude modulation-4
(PAM-4) signal having four levels through an output node,
and a receiver that is connected to the transmitter through a
channel and receives the PAM-4 signal, wherein the trans-
mitter may compensate for attenuation of the PAM-4 signal
based on a first operating voltage, compensate for the
attenuation based on applying a second operating voltage
having a level greater than a level of the first operating
voltage to the output node when a transition from a first level
to a second level among the four levels is a rising transition,
and compensate for the attenuation based on forming a path
for extracting an equalizing current from the output node
when the transition from the first level to the second level is
a falling transition.

For example, the receiver may be terminated with the first
operating voltage.

BRIEF DESCRIPTION OF THE FIGURES

The above and other objects and features of the present
disclosure will become apparent by describing in detail
embodiments thereof with reference to the accompanying
drawings.

DETAILED DESCRIPTION

Hereinafter, embodiments of the present disclosure will
be described clearly and in detail so that those skilled in the
art can easily carry out embodiments of the present disclo-
sure.

Figure 1:
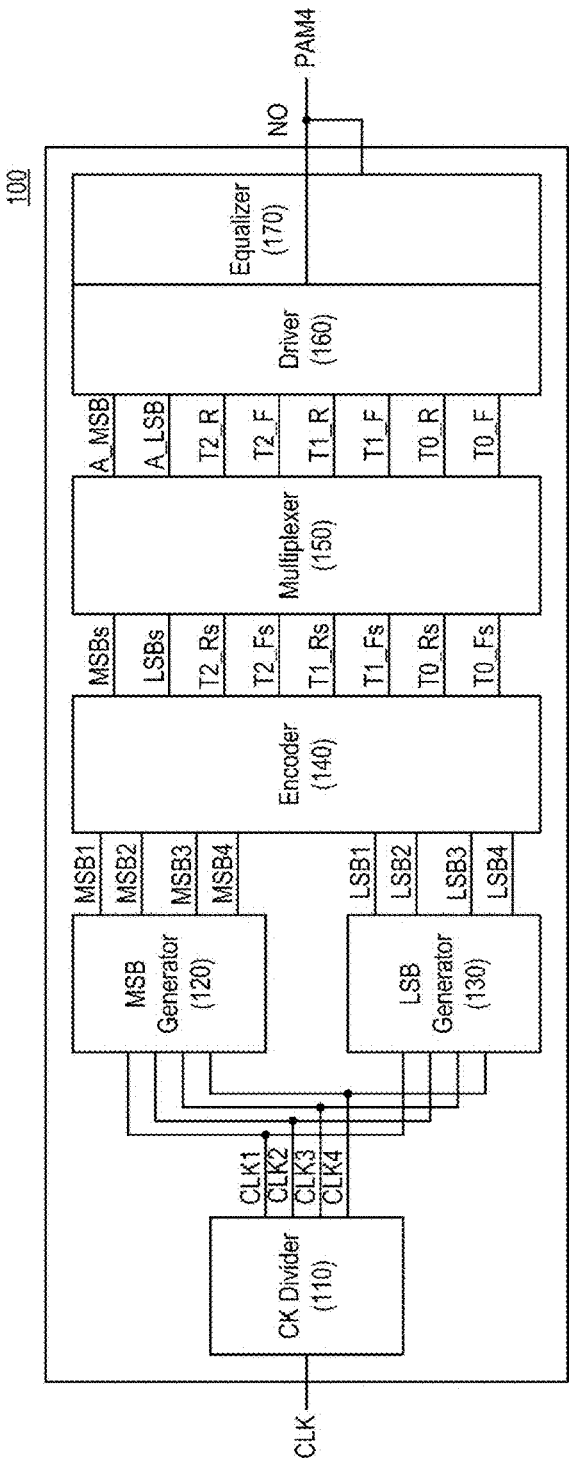
FIG. 1 is a diagram illustrating a transmitter according to
some embodiments.

FIG. 1 is a diagram illustrating a transmitter 100 accord-
ing to some embodiments.

Referring to FIG. 1, the transmitter 100 according to some
embodiments may include a clock divider 110, an MSB
generator 120 for generating a most significant bit (MSB),
an LSB generator 130 for generating a least significant bit
(LSB), an encoder 140, a multiplexer 150, a driver 160, and
an equalizer 170.

The clock divider 110 may be configured to generate a
plurality of clock signals CLK1 to CLK4 for a plurality of
phases based on an input clock signal CLK. For example, the
clock divider 110 may output the plurality of clock signals
CLK1 to CLK4 having four phases, and each clock signal
may have a phase difference of 90 n (where n is a natural
number) from each other. The plurality of clock signals
CLK1 to CLK4 may be equally applied to the MSB gen-
erator 120 and the LSB generator 130.

The operating speed of the transmitter 100 may be
improved through the plurality of clock signals CLK1 to
CLK4 having multiple phases. In detail, the slow operation
speed of the encoder 140 described below may be improved.

The MSB generator 120 and the LSB generator 130 may
receive the plurality of clock signals CLK1 to CLK4 from
the clock divider 110 and generate an MSB or an LSB based
on the plurality of clock signals CLK1 to CLK4 received.
The MSB and LSB constitute a 2-bit signal, and the 2-bit
signal is eventually converted and output as a PAM-4 signal
with 4 levels through the transmitter 100.

The MSB generator 120 may be configured to generate
MSBs for each of the plurality of phases and output the
MSBs to the encoder 140. For example, a first MSB MSB1
may have the phase of the first clock signal CLK1, a second
MSB MSB2 may have the phase of the second clock signal
CLK2, a third MSB MSB3 may have the phase of the first
clock signal CLK1, and a fourth MSB MSB4 may have the
phase of the fourth clock signal.

The LSB generator 130 may be configured to generate
LSBs for each of the plurality of phases and output the LSBs
to the encoder 140. For example, a first LSB LSB1 may have
the phase of the first clock signal CLK1, a second LSB LSB2
may have the phase of the second clock signal CLK2, a third
LSB LSB3 may have the phase of the third clock signal
CLK3, and a fourth LSB LSB4 may have the phase of the
fourth clock signal CLK4.

The encoder 140 may be connected to the MSB generator
120 and the LSB generator 130, and may be configured to
encode the MSB and LSB for the plurality of phases and
output an encoded signal. Through the encoder 140, the
encoding signal and the plurality of MSBs and the plurality
of LSBs may be output together.

The encoding signal may include a plurality of first
thermometer signals T0_Rs, T1_Rs and T2_Rs for a rising
transition and a plurality of second thermometer signals
T0_Fs, T1_Fs and T2_Fs for a falling transition.

In the present disclosure, the thermometer signal expresses a signal with three bits, unlike a binary signal that expresses a signal with two bits. That is, in PAM-4 modulation, the thermometer signal represents four levels of the PAM-4 signal. In FIG. 1, T0, T1, and T2 may each correspond to one of three bits.

In addition, in order to distinguish the thermometer signal for each transition, for convenience, the thermometer signal for the rising transition may be defined as the first thermometer signal, and the thermometer signal for the falling transition may be defined as the second thermometer signal.

In addition, in the present disclosure, a transition means a signal transition between different levels among the four levels of a PAM-4 signal. When two arbitrary levels are defined as the first level and the second level, the case where the second level is higher than the first level is a rising transition, and the case where the second level is lower than the first level is a falling transition.

The number of the plurality of first thermometer signals T0_Rs, T1_Rs and T2_Rs and the number of the plurality of second thermometer signals T0_Fs, T1_Fs and T2_Fs may correspond to the phases of the plurality of clock signals CLK1 to CLK4 output from the clock divider 110. For example, the (1-1)-th thermometer signal T0_Rs may include four signals having different phases, and similarly, the (2-1)-th thermometer signal T0_Fs may include four signals having different phases.

The multiplexer 150 may be configured to perform a merging operation that reduces the unit interval (UI) of the plurality of first thermometer signals T0_Rs, T1_Rs and T2_Rs and the plurality of second thermometer signals T0_Fs, T1_Fs and T2_Fs. The multiplexer 150 according to the present disclosure may also be called a serializer. Through the merging operation, the output signal of the multiplexer 150 has a data rate (i.e., frequency) that is N times that of the input signal (where 'N' is a natural number). For example, when implemented as a 4:1 multiplexer 150, the output signal may have a data rate of four times.

For example, the plurality of MSBs MSBs are converted into merged MSBs A_MSBs and the plurality of LSBs LSBs are converted into merged LSBs A_LSBs through the multiplexer 150. In addition, the plurality of (1-1)-th thermometer signals T0_Rs, the plurality of (2-1)-th thermometer signals T0_Fs, the plurality of (1-2)-th thermometer signals T1_Rs, the plurality of (2-2)-th thermometer signals T1_Fs, the plurality of (1-3)-th thermometer signals T2_Rs, and the plurality of (2-3)-th thermometer signals T2_Fs are each converted into merged thermometer signals T0_R, T0_F, T1_R, T1_F, T2_R, and T2_F.

Accordingly, the multiplexer 150 may output a plurality of merged first thermometer signal T0_R, T1_R and T2_R and a plurality of merged second thermometer signals T0_F, T1_F and T2_F according to the merging operation to the equalizer 170.

Meanwhile, when encoding is connected to the input terminal of the multiplexer 150 according to the embodiments described above, because encoding is performed before the merging operation, the PAM-4 signal may have a margin such that a time error does not occur.

The driver 160 may be connected to an output node NO and be configured to drive the MSB and the LSB, specifically the merged MSB A_MSB and the merged LSB A_LSB, to the output node NO as the PAM-4 signal.

The equalizer 170 may be connected to the output node NO and be configured to compensate for attenuation of the PAM-4 signal based on a first operating voltage VDD. In this case, the first operating voltage VDD may be an operating voltage of the transmitter 100.

According to some embodiments, the equalizer 170 may be implemented as a feed-forward equalizer (FFE) (or, a pre-transform equalizer).

The equalizer 170 may perform a compensation operation according to a rising transition or a falling transition based on a plurality of merged first thermometer signals and a plurality of merged second thermometer signals output from the multiplexer 150.

According to some embodiments, the equalizer 170 may compensate for attenuation based on applying a second operating voltage having a level higher than that of the first operating voltage VDD to the output node NO when the transition from the first level to the second level among the four levels is a rising transition. For example, the operation of compensating for attenuation for the rising transition may be performed based on a charge pump.

Alternatively, when the transition from the first level to the second level is a falling transition, the equalizer 170 may compensate for attenuation based on forming a path along which an equalizing current flows out from the output node NO.

According to the embodiments described above, in the case of a rising transition, the attenuation may be compensated in a voltage rising direction through the second operating voltage having a level higher than that of the first operating voltage VDD, which is a basic operating voltage. In addition, in the case of a falling transition, the attenuation may be compensated in a voltage falling direction in which the equalizing current flows out from the output node NO. That is, the overall signal level may be maintained.

In PAM-4 modulation, because the overall signal level and the width between voltage levels may decrease when the strength of the equalizer 170 is increased, the frequency of error occurrence at the receiving end may increase and the sampling margin may decrease. To the contrary, according to the present disclosure, when the decrease is compensated for by in a high level voltage in the rising transition, it is possible to prevent the overall signal level from decreasing. Therefore, high data transmission rates may be maintained and high data accuracy may be ensured. In addition, because the margin of the overall signal is not reduced, the sampling interval with a low data error rate at a receiving end may be widened.

Figure 2:
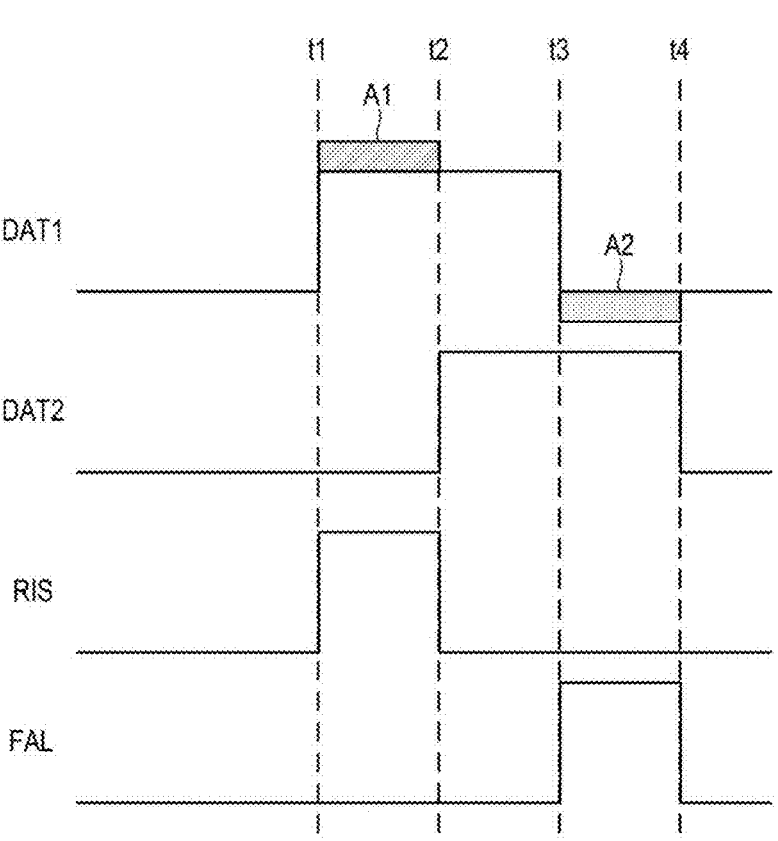
FIG. 2 is a timing diagram illustrating the compensation
operation in FIG. 1.

FIG. 2 is a timing diagram illustrating the compensation operation in FIG. 1.

Referring to FIG. 2, first data DAT1 at an arbitrary time point has a high level from t1 to t3, and second data DAT2 obtained by delaying the first data DAT1 by one UI has a high level from t2 to t4. That is, a rising transition occurs during t1 to t2, and a falling transition occurs during t3 to t4. The levels of the first data DAT1 and the second data DAT2 may have one of the PAM-4 levels described above.

In this case, a rising signal RIS may be defined as the product of the first data DAT1 and the bar signal of the second data DAT2, and a falling signal FAL may be defined as the product of the bar signal of the first data DAT1 and the second data DAT2. The rising signal RIS may be one of the plurality of merged first thermometer signals output from the multiplexer 150 of FIG. 1 described above, and the falling signal FAL may be one of the plurality of merged second thermometer signals output from the multiplexer 150 of FIG. 1 described above. The rising signal RIS and falling signal FAL are used for the compensation operation of the equalizer 170.

Referring to FIG. 2 again, when the attenuation compensation for the rising transition and the falling transition is performed according to the embodiments described above, the first data DAT1 has a level that is increased by A1 more than the existing high level voltage, and has a level that is lowered by A2 lower than the existing low level voltage. Accordingly, because the first data DAT1 is changed in a direction that emphasizes the data transition, the compensation operation may be performed without reducing the overall signal level.

Figure 3:
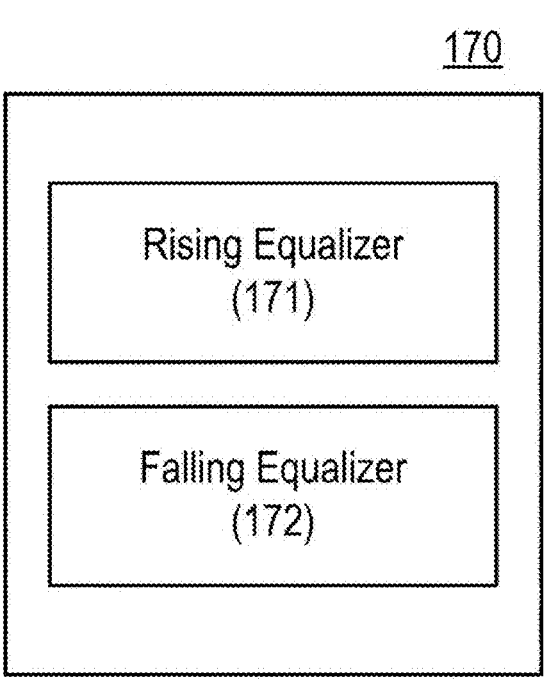
FIG. 3 is a block diagram illustrating an equalizer accord-
ing to some embodiments.

FIG. 3 is a block diagram illustrating an equalizer according to some embodiments.

Referring to FIG. 3, the equalizer 170 according to some embodiments may include a rising equalizer 171 and a falling equalizer 172.

The rising equalizer 171 may perform a compensation operation for a rising transition. According to some embodiments, the rising equalizer 171 may compensate for attenuation based on applying a second operating voltage having a level higher than that of the first operating voltage VDD to an output node of the transmitter 100.

The falling equalizer 172 may perform a compensation operation for the falling transition. According to some embodiments, the falling equalizer 172 may compensate for attenuation based on forming a path along which the equalizing current is drawn out from the output node of the transmitter 100.

Hereinafter, specific embodiments of the rising equalizer 171 and the falling equalizer 172 will be described.

Figure 4:
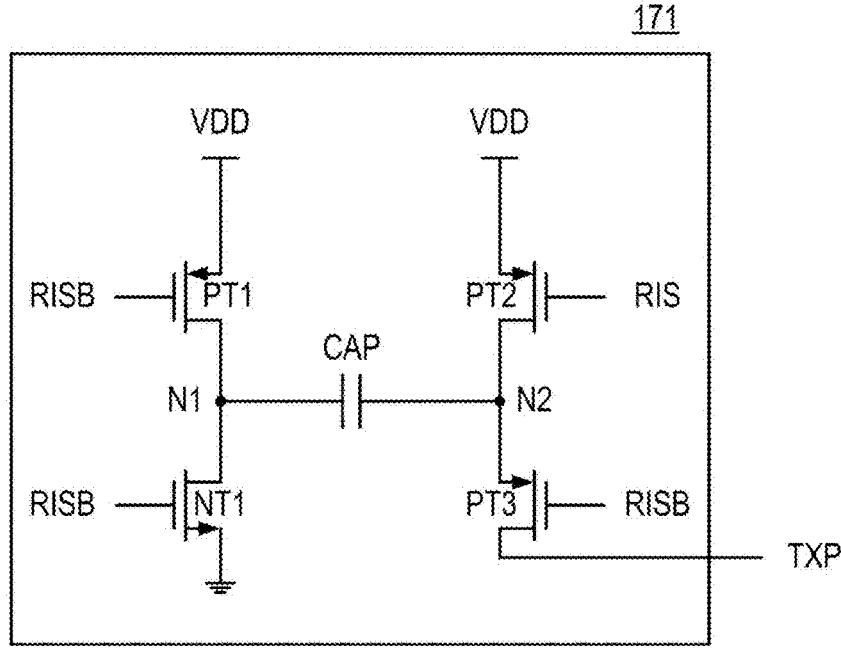
FIG. 4 is a circuit diagram illustrating the rising equalizer
of FIG. 3 according to some embodiments.

FIG. 4 is a circuit diagram illustrating the rising equalizer of FIG. 3 according to some embodiments.

Referring to FIG. 4, the rising equalizer 171 according to some embodiments includes a capacitor CAP, a first P-type transistor PT1, a second P-type transistor PT2, a third P-type transistor PT3, and a first N-type transistor NT1.

The capacitor CAP is connected to a first node N1 and a second node N2 to charge and discharge a voltage for attenuation compensation in a rising transition.

The first P-type transistor PT1 and the first N-type transistor NT1 are connected to the first node N1, and the second P-type transistor PT2 and the third P-type transistor PT3 are connected to the second node N2.

The first P-type transistor PT1 has a drain connected to the first node N1 and a source to which the first operating voltage VDD is applied. In addition, a rising bar signal RISB, which is a bar signal of the rising signal RIS, is applied to the gate of the first P-type transistor PT1.

The second P-type transistor PT2 has a drain connected to the second node N2 and a source to which the first operating voltage VDD is applied. In addition, the rising signal RIS is applied to the gate of the first P-type transistor PT2.

The first N-type transistor NT1 has a drain connected to the first node N1 and a source grounded. In addition, the rising bar signal RISB is applied to the gate of the first N-type transistor NT1.

The third P-type transistor PT3 has a source connected to the second node N2 and a drain connected to the output node. In addition, the rising bar signal RISB is applied to the gate of the third P-type transistor PT3.

Figure 5:
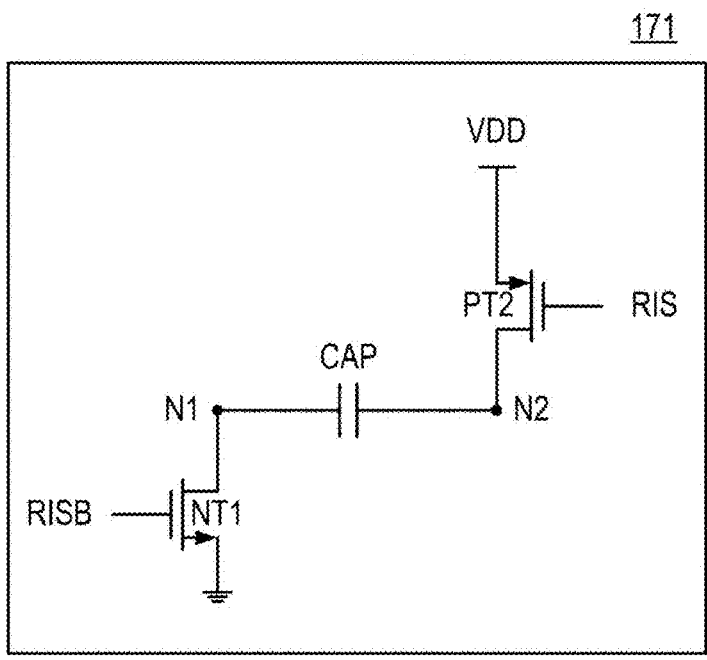
FIGS. 5 and 6 are circuit diagrams illustrating the opera-
tion of the rising equalizer in FIG. 4.
Figure 6:
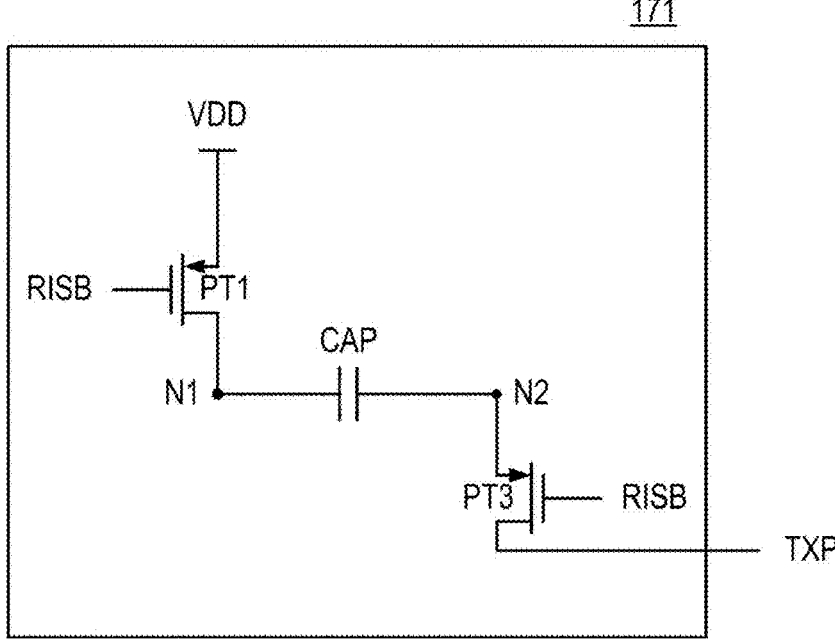

FIGS. 5 and 6 are circuit diagrams illustrating the operation of the rising equalizer in FIG. 4.

First, referring to FIG. 5, when the rising signal RIS is at a low level, that is, when the rising bar signal RISB is at a high level, it is not in a rising transition.

When it is not in a rising transition, the first P-type transistor PT1 and the third P-type transistor PT3 are turned off and the second P-type transistor PT2 and the N-type transistor are turned on, thereby charging the capacitor CAP with the first operating voltage VDD. That is, the voltage between the first node N1 and the second node N2 may be the first operating voltage VDD.

Next, referring to FIG. 6, when the rising signal RIS is at a high level, that is, when the rising bar signal RISB is at a low level, it is in a rising transition.

When it is in a rising transition, the second P-type transistor PT2 and the N-type transistor are turned off and the first P-type transistor PT1 and the third P-type transistor PT3 are turned on, so that a second operating voltage is applied to the output node. In this case, the first operating voltage VDD charged at both terminals of the capacitor CAP and the first operating voltage VDD due to the turn-on of the first P-type transistor PT1 may be applied together to the output node.

That is, the second operating voltage higher than the first operating voltage VDD is applied to the output node.

Accordingly, the rising equalizer 171 may compensate for channel attenuation by generating a voltage higher than the basic operating voltage when compensating for data of a rising transition after storing charges in the capacitor CAP.

Figure 7:
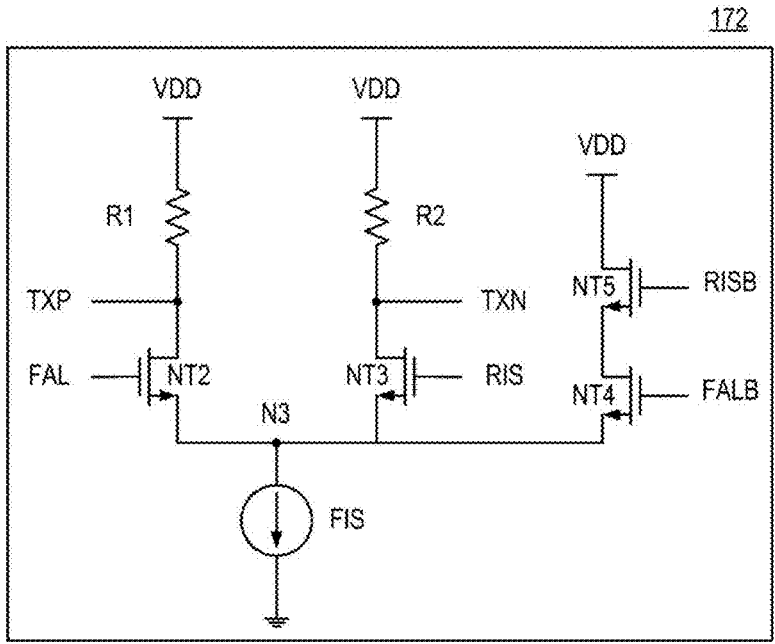
FIG. 7 is a circuit diagram illustrating the falling equalizer
in FIG. 3 according to some embodiments.

FIG. 7 is a circuit diagram illustrating the falling equalizer in FIG. 3 according to some embodiments.

Referring to FIG. 7, the falling equalizer 172 according to some embodiments may include an equalizing current source FIS, a second N-type transistor NT2, a third N-type transistor NT3, a fourth N-type transistor NT4, and a fifth N-type transistor NT5.

The equalizing current source FIS may be connected to a third node N3 to allow an equalizing current to flow into the ground. For example, the equalizing current may be set to a specific current value for compensating for attenuation compensation in a falling transition.

The second N-type transistor NT2 has a drain connected to a first output node TXP and a source connected to the third node N3. In addition, the falling signal FAL is applied to the gate of the second N-type transistor NT2. In addition, hereinafter, the output node may include the first output node TXP and a second output node TXN corresponding to each channel when the transmitter 100 is connected to two channels (e.g., differential channels).

The first operating voltage VDD may be applied to the first output node TXP through a first resistor R1.

The third N-type transistor NT3 has a drain connected to the second output node TXN and a source connected to the third node N3. In addition, the rising signal RIS is applied to the gate of the second N-type transistor NT2.

The first operating voltage VDD may be applied to the second output node TXN through a second resistor R2.

The fourth N-type transistor NT4 and the fifth N-type transistor NT5 may be connected in a cascode structure. The fourth N-type transistor NT4 has a source connected to the third node N3 and a drain connected to the source of the fifth N-type transistor NT5. In addition, a falling bar signal FALB, which is a bar signal of the falling signal FAL, is applied to the gate of the fourth N-type transistor NT4.

The fifth N-type transistor NT5 has a drain to which the first operating voltage VDD is applied and a source connected to the source of the fourth N-type transistor NT4. In addition, the rising bar signal RISB is applied to the gate of the fifth N-type transistor NT5.

Figure 8:
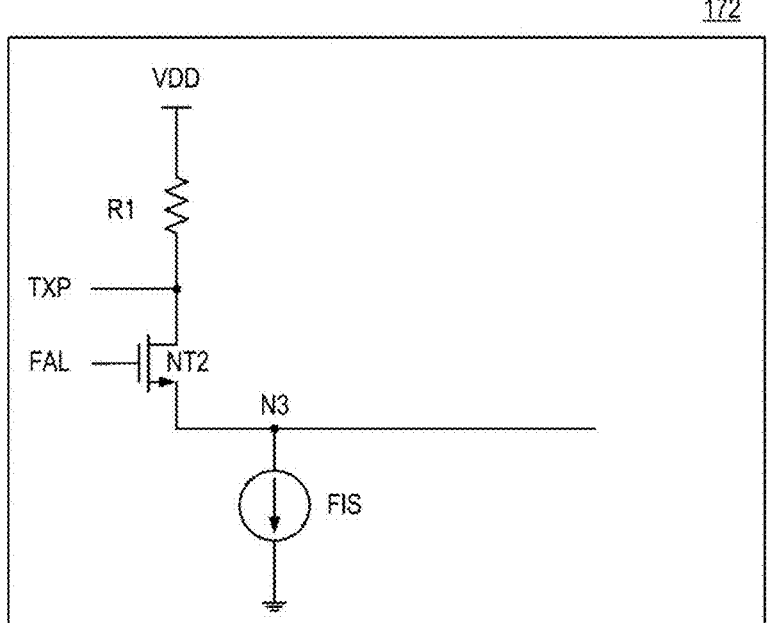
FIGS. 8 to 10 are diagrams illustrating the operation of the
falling equalizer in FIG. 7.
Figure 9:
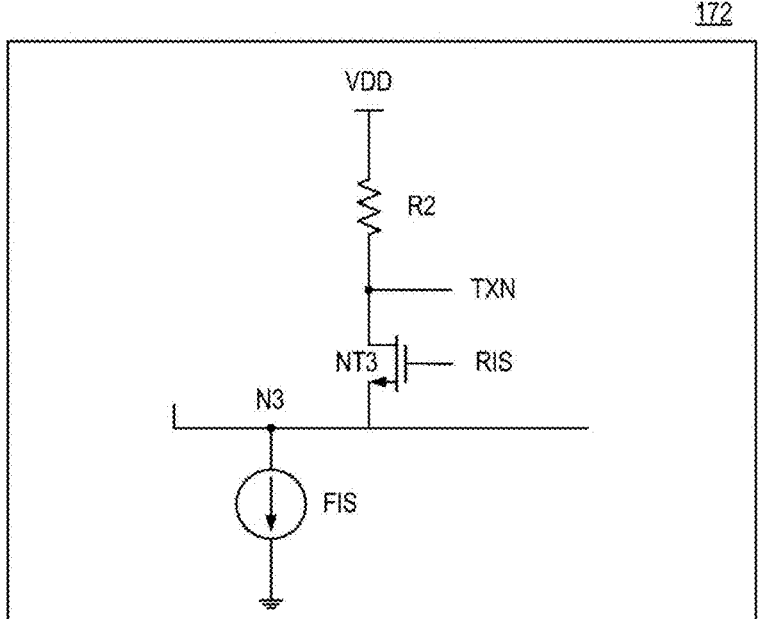
Figure 10:
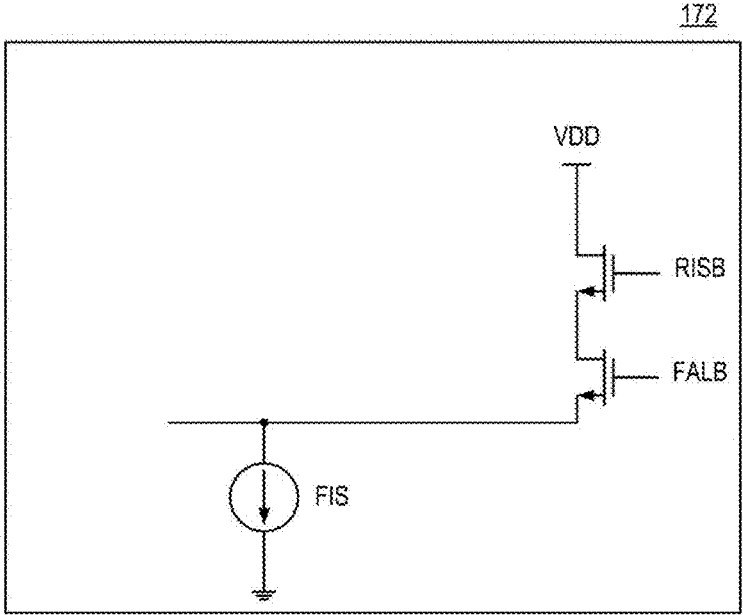

FIGS. 8 to 10 are diagrams illustrating the operation of the falling equalizer in FIG. 7.

First, referring to FIG. 8, when the falling signal FAL is at a high level, that is, when it is in a falling transition, the falling bar signal FALB and the rising bar signal RISB have low levels. Therefore, as the third to fifth N-type transistors NT3 to NT5 are turned off and the second N-type transistor NT2 is turned on, the equalizing current flows out from the first output node TXP. That is, the voltage of the first output node TXP decreases.

Next, referring to FIG. 9, when the rising signal RIS is at a high level, that is, when it is in a rising transition, the second N-type transistor NT2, the fourth N-type transistor NT4, and the fifth N-type transistor NT5 are turned off and the third N-type transistor NT3 is turned on, thereby causing an equalizing current to flow out from the second output node TXN. That is, the voltage of the second output node TXN decreases.

Finally, referring to FIG. 10, when there is neither a rising transition nor a falling transition, that is, when both the rising bar signal RISB and the falling bar signal FALB are at high levels, the second N-type transistor NT2 and the third N-type transistor NT3 are turned off and the fourth N-type transistor NT4 and the fifth N-type transistor NT5 are turned on, thereby maintaining the equalizing current.

That is, according to the embodiments described above, the falling equalizer 172 may prevent the overall signal level from decreasing by reducing the voltage of the output node in a falling transition. In addition, when there is no falling transition, the falling equalizer 172 may maintain the current path such that the equalizing current source FIS operates normally.

Figure 11:
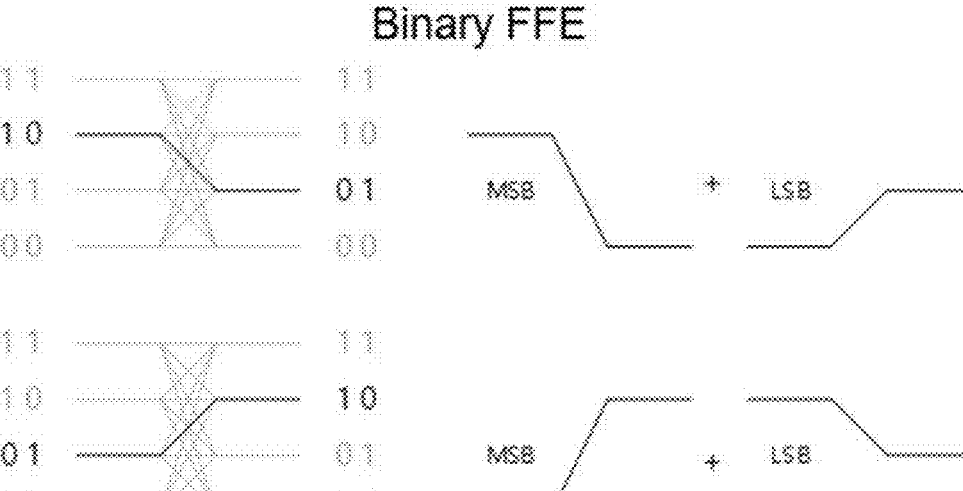
FIG. 11 is a diagram illustrating a transition of a PAM-4
signal in a binary encoding manner.
Figure 12:
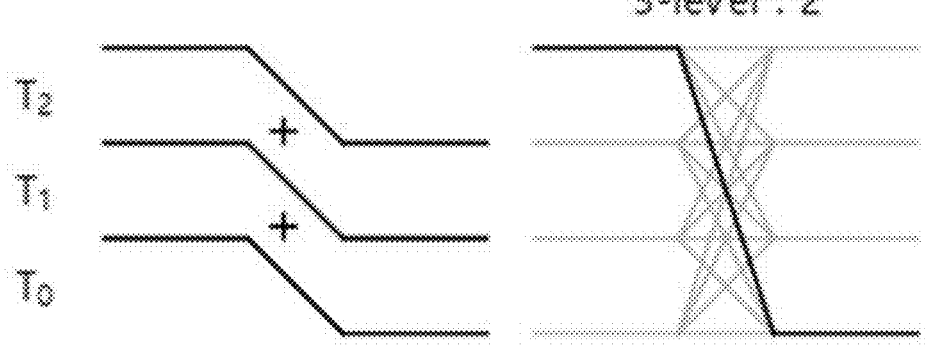
FIGS. 12 to 14 are diagrams illustrating transitions of a
PAM-4 signal in a thermometer encoding manner according
to some embodiments.
Figure 13:
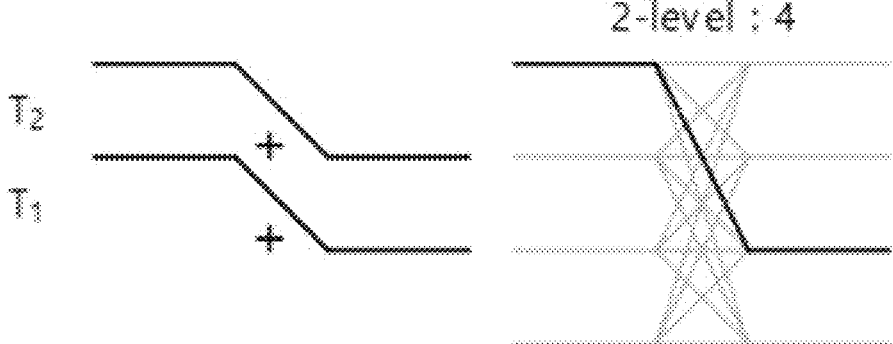
Figure 14:
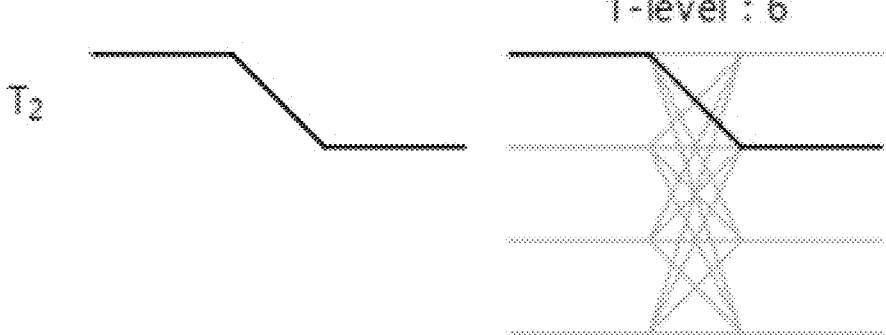

FIG. 11 is a diagram illustrating a transition of a PAM-4 signal in a binary encoding manner. FIGS. 12 to 14 are diagrams illustrating transitions of a PAM-4 signal in a thermometer encoding manner according to some embodiments.

First, referring to FIG. 11, when a falling transition (or rising transition) occurs as illustrated, one level of transition may be compensated. In a binary encoding manner, four levels are expressed with two bits, so two level falling transitions are required in the MSB and one level rising transition is required in the LSB. That is, as the MSB and LSB overlap, compensation operations are required redundantly.

Meanwhile, referring to FIGS. 12 to 14, in a three-level transition (FIG. 12) having two transition states, each thermometer code T0 to T2 requires one level of falling transition, so transitions do not overlap with each other. Additionally, in a two-level transition (FIG. 13) with four transition states, each thermometer code T1 or T2 also requires one level of falling transition, so transitions do not overlap with each other. Similarly, in a one-level transition (FIG. 14) with six transition states, only one level of falling transition is required for one thermometer code T2. That is, according to the embodiments described above (FIGS. 1 to 10), the transmitter according to the present disclosure encodes a signal in a thermometer encoding manner, and therefore may be operable energy-efficiently without overlapping compensation.

Figure 15:
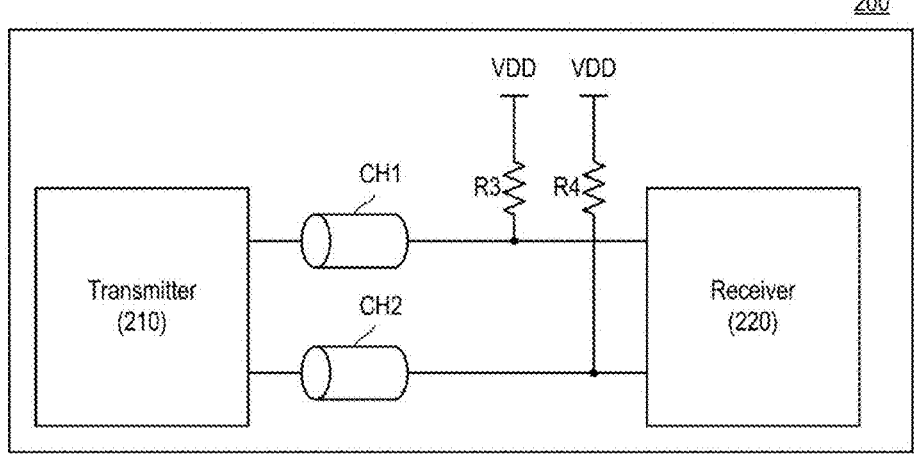
FIG. 15 is a circuit diagram illustrating a transceiver
according to some embodiments.

FIG. 15 is a circuit diagram illustrating a transceiver according to some embodiments.

Referring to FIG. 15, a transceiver 200 according to some embodiments includes a transmitter 210 and a receiver 220.

The transmitter 210 is configured to transmit a PAM-4 signal having four levels through an output node.

According to some embodiments, the transmitter 210 may be implemented according to the embodiments described above (FIGS. 1 to 10). According to some embodiments, the transmitter 210 may compensate for attenuation of a PAM-4 signal based on the first operating voltage VDD, and may compensate for the attenuation based on applying a second operating voltage having a level greater than that of the first operating voltage VDD to the output node when a transition from a first level to a second level among the four levels is a rising transition. In addition, the transmitter 210 may compensate for attenuation based on forming a path along which an equalizing current flows out from the output node when the transition from the first level to the second level is a falling transition.

The receiver 220 may be connected to the transmitter 210 through a channel and be configured to receive a PAM-4 signal. For example, the receiver 220 may be connected to the transmitter 210 through differential channels CH1 and CH2 and receive differential PAM-4 signals.

The receiver 220 may decode the received PAM-4 signal. For example, the receiver 220 may decode original data through a comparison operation between the PAM-4 signal and reference voltages.

According to some embodiments, the receiver 220 may be terminated to the first operating voltage VDD. For example, the receiver 220 may be terminated via termination resistors R3 and R4 to which the first operating voltage VDD is applied. When the receiver 220 is terminated at the operating voltage, the receiver 220 may operate on a high-speed input/output interface.

According to the embodiments described above, the transceiver 200 of the present disclosure may compensate for a data margin without reducing PAM-4 signal swing even when used for high-speed data transmission and reception as the receiver 220 is terminated at the operating voltage.

Figure 16:
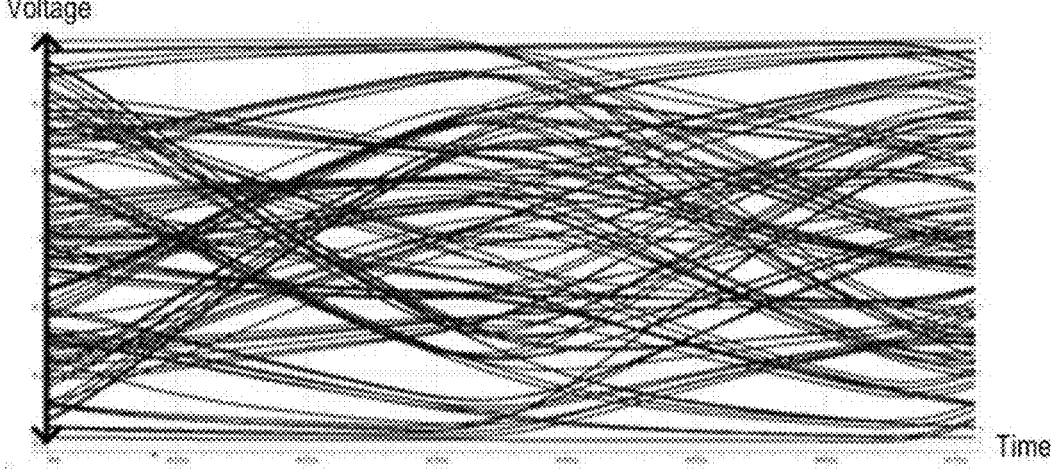
FIGS. 16 and 17 are eye diagrams illustrating a PAM-4
signal.
Figure 17:
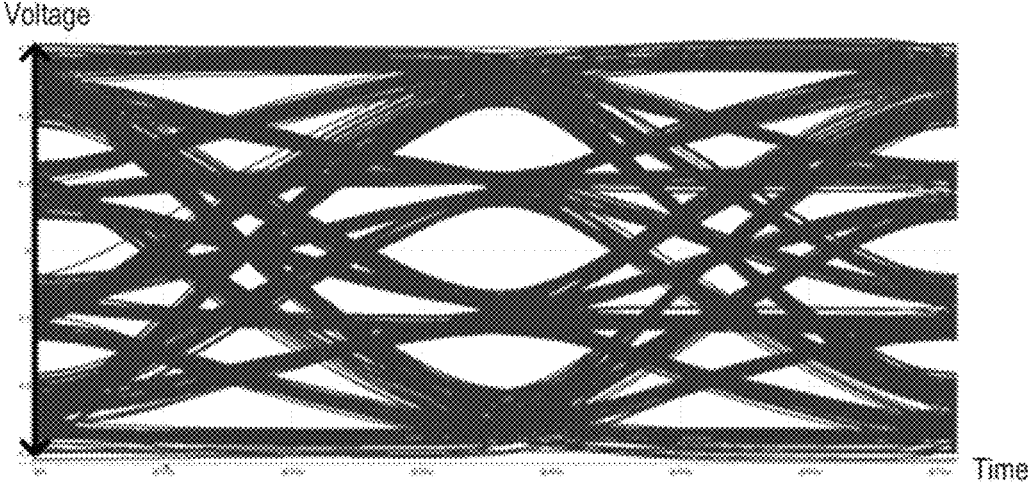

FIGS. 16 and 17 are eye diagrams illustrating a PAM-4 signal.

FIG. 16 is an eye diagram when no equalizer is applied to a transmitter. It may be understood that the opening and margin of the eye diagram are deteriorated as attenuation is not compensated.

To the contrary, FIG. 17 is an eye diagram when an equalizer according to the embodiments described above is applied to a transmitter. It may be understood that the opening and margin of the eye diagram are improved as attenuation is compensated.

Figure 18:
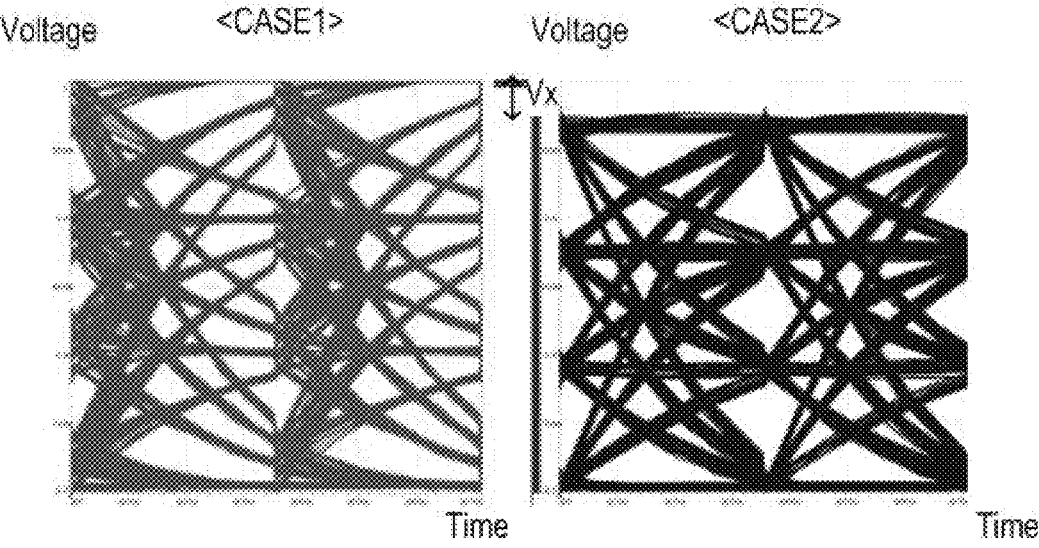
FIG. 18 is an eye diagram illustrating a PAM-4 signal
according to cases.

FIG. 18 is an eye diagram illustrating a PAM-4 signal according to cases.

Referring to FIG. 18, it may be understood that the overall level of the PAM-4 signal is higher in Case 1 in which an equalizer according to embodiments of the present disclosure is applied, compared to Case 2 in which an equalizer according to embodiments of the present disclosure is not applied.

Therefore, through the transmitter and transceiver according to the embodiments described above, it is possible to compensate for attenuation without reducing the swing of a PAM-4 signal.

According to the present disclosure, a PAM-4 transmitter and transceiver using an FFE, which are capable of increasing a data voltage margin, may be provided.

Specific embodiments have been described above. The present disclosure may include not only the above-described embodiments, but also simple design changes or easily changeable embodiments. In addition, the present disclosure may include techniques that can easily modify and implement the embodiments. Therefore, the scope of the present disclosure should not be limited to the above-described embodiments, but should be defined by the claims described below as well as the claims and equivalents.

What is claimed is:

1. A transmitter comprising:
a driver connected to an output node and configured to drive the output node with a pulse amplitude modulation-4 (PAM-4) signal having four levels of a most significant bit (MSB) and a least significant bit (LSB); and
an equalizer connected to the output node and configured to compensate for attenuation of the PAM-4 signal based on a first operating voltage,
wherein the equalizer is configured to:
compensate for the attenuation based on applying a second operating voltage having a level greater than a level of the first operating voltage to the output node when a transition from a first level to a second level among the four levels is a rising transition; and
compensate for the attenuation based on forming a path for extracting an equalizing current from the output node when the transition from the first level to the second level is a falling transition.

2. The transmitter of claim 1, wherein the equalizer includes:
a rising equalizer configured to perform a compensation operation for the rising transition; and
a falling equalizer configured to perform a compensation operation for the falling transition.

3. The transmitter of claim 2, wherein the rising equalizer includes:
a capacitor connected to a first node and a second node;
a first P-type transistor having a drain connected to the first node and a source to which the first operating voltage is applied;
a second P-type transistor having a drain connected to the second node and a source to which the first operating voltage is applied;
a first N-type transistor having a drain connected to the first node and a source grounded; and
a third P-type transistor having a source connected to the second node and a drain connected to the output node.

4. The transmitter of claim 3, wherein the first operating voltage is charged in the capacitor as the first P-type transistor and the third P-type transistor are turned off and the second P-type transistor and the N-type transistor are turned on when the transition is not the rising transition, and
the second operating voltage is applied to the output node as the second P-type transistor and the N-type transistor are turned off and the first P-type transistor and the third P-type transistor are turned on when the transition is the rising transition.

5. The transmitter of claim 2, wherein the falling equalizer includes:
an equalizing current source connected to a third node and configured to allow the equalizing current to flow into a ground;
a second N-type transistor having a drain connected to the output node and a source connected to the third node;
a third N-type transistor having a drain connected to the output node and a source connected to the third node;
a fourth N-type transistor having a source connected to the third node; and
a fifth N-type transistor having a drain to which the first operating voltage is applied and a source connected to the source of the fourth N-type transistor.

6. The transmitter of claim 5, wherein the equalizing current flows out from the output node as the third N-type transistor to the fifth N-type transistor are turned off and the second N-type transistor is turned on when the transition is the falling transition, and
the equalizing current is maintained as the second N-type transistor and the third N-type transistor are turned off and the fourth N-type transistor and the fifth N-type transistor are turned on when the transition is neither the rising transition nor the falling transition.

7. The transmitter of claim 1, further comprising:
an encoder configured to encode the MSB and the LSB for a plurality of phases and output an encoding signal, wherein the encoding signal includes a plurality of first thermometer signals for the rising transition and a plurality of second thermometer signals for the falling transition; and
a multiplexer configured to perform a merging operation for reducing a unit interval (UI) of the plurality of first thermometer signals and the plurality of second thermometer signals.

8. The transmitter of claim 7, wherein the multiplexer is configured to output a plurality of merged first thermometer signals and a plurality of merged second thermometer signals according to the merging operation to the equalizer, and
the equalizer is configured to perform a compensation operation according to the rising transition or the falling transition based on the plurality of merged first thermometer signals and the plurality of merged second thermometer signals.

9. The transmitter of claim 7, further comprising:
a clock divider configured to generate a plurality of clock signals for the plurality of phases;
an MSB generator configured to generate the MSB for each of the plurality of phases based on the plurality of clock signals and output the MSB to the encoder; and
an LSB generator configured to generate the LSB for each of the plurality of phases based on the plurality of clock signals and output the LSB to the encoder.

10. A transmitter comprising:
a driver connected to an output node and configured to drive the output node with a pulse amplitude modulation-4 (PAM-4) signal having four levels of a most significant bit (MSB) and a least significant bit (LSB); and
a rising equalizer and a falling equalizer connected to the output node and configured to compensate for attenuation of the PAM-4 signal based on a first operating voltage,
wherein the rising equalizer includes:
a capacitor connected to a first node and a second node;
a first P-type transistor having a drain connected to the first node and a source to which the first operating voltage is applied;
a second P-type transistor having a drain connected to the second node and a source to which the first operating voltage is applied;
a first N-type transistor having a drain connected to the first node and a source grounded; and
a third P-type transistor having a source connected to the second node and a drain connected to the output node, and
the falling equalizer includes:
an equalizing current source connected to a third node and configured to allow an equalizing current to flow into a ground;
a second N-type transistor having a drain connected to the output node and a source connected to the third node;

a third N-type transistor having a drain connected to the output node and a source connected to the third node;

a fourth N-type transistor having a source connected to the third node; and a fifth N-type transistor having a drain to which the first operating voltage is applied and a source connected to the source of the fourth N-type transistor.

11. A transceiver comprising:

a transmitter configured to transmit a pulse amplitude modulation-4 (PAM-4) signal having four levels through an output node; and a receiver connected to the transmitter through a channel and configured to receive the PAM-4 signal, wherein the transmitter is configured to:

compensate for attenuation of the PAM-4 signal based on a first operating voltage;

compensate for the attenuation based on applying a second operating voltage having a level greater than a level of the first operating voltage to the output node when a transition from a first level to a second level among the four levels is a rising transition; and compensate for the attenuation based on forming a path for extracting an equalizing current from the output node when the transition from the first level to the second level is a falling transition.

12. The transceiver of claim 11, wherein the receiver is configured to be terminated with the first operating voltage.

* * * * *